United States Patent
Ewer et al.

[11] Patent Number: 5,902,959
[45] Date of Patent: May 11, 1999

[54] LEAD FRAME WITH WAFFLED FRONT AND REAR SURFACES

[75] Inventors: Peter R. Ewer, Surrey, United Kingdom; Alex Kamara, Santa Monica, Calif.; Kevin Smith, Surrey, United Kingdom; Mark Steers, West Sussex, United Kingdom; Arthur Woodworth, Surrey, United Kingdom

[73] Assignee: International Rectifier Corporation, El Segundo, Calif.

[21] Appl. No.: 08/872,819

[22] Filed: Jun. 11, 1997

Related U.S. Application Data

[60] Provisional application No. 60/025,832, Sep. 5, 1996.
[51] Int. Cl.$^6$ ........................................ H01L 23/02
[52] U.S. Cl. .................. 174/52.4; 257/713; 257/675; 257/676
[58] Field of Search ...................... 257/779, 774, 257/712, 713, 675, 676; 361/688, 702, 707, 718; 174/52.4

[56] References Cited

U.S. PATENT DOCUMENTS

| | | | |
|---|---|---|---|
| 5,214,307 | 5/1993 | Davis | 257/676 |
| 5,255,157 | 10/1993 | Hegel | 361/783 |
| 5,278,446 | 1/1994 | Nagaraj et al. | 257/707 |
| 5,397,915 | 3/1995 | Nose | 257/676 |
| 5,430,331 | 7/1995 | Hamzehdoost et al. | 257/796 |
| 5,637,925 | 6/1997 | Ludden et al. | 257/774 |
| 5,659,199 | 8/1997 | Mori et al. | 257/676 |

*Primary Examiner*—Kristine Kincaid
*Assistant Examiner*—Hung V. Ngo
*Attorney, Agent, or Firm*—Ostrolenk, Faber, Gerb & Soffen, LLP

[57] ABSTRACT

A surface mount semiconductor package includes a semiconductor device, a metal pad on which the semiconductor device is mounted, and a housing formed of a flowable material which bonds to the metal pad and encapsulates the semiconductor device when cured, where the metal pad includes a waffled surface opposite the surface on which the semiconductor device is mounted for accepting solder between the metal pad and a substrate and for permitting solder wetting therebetween.

8 Claims, 5 Drawing Sheets

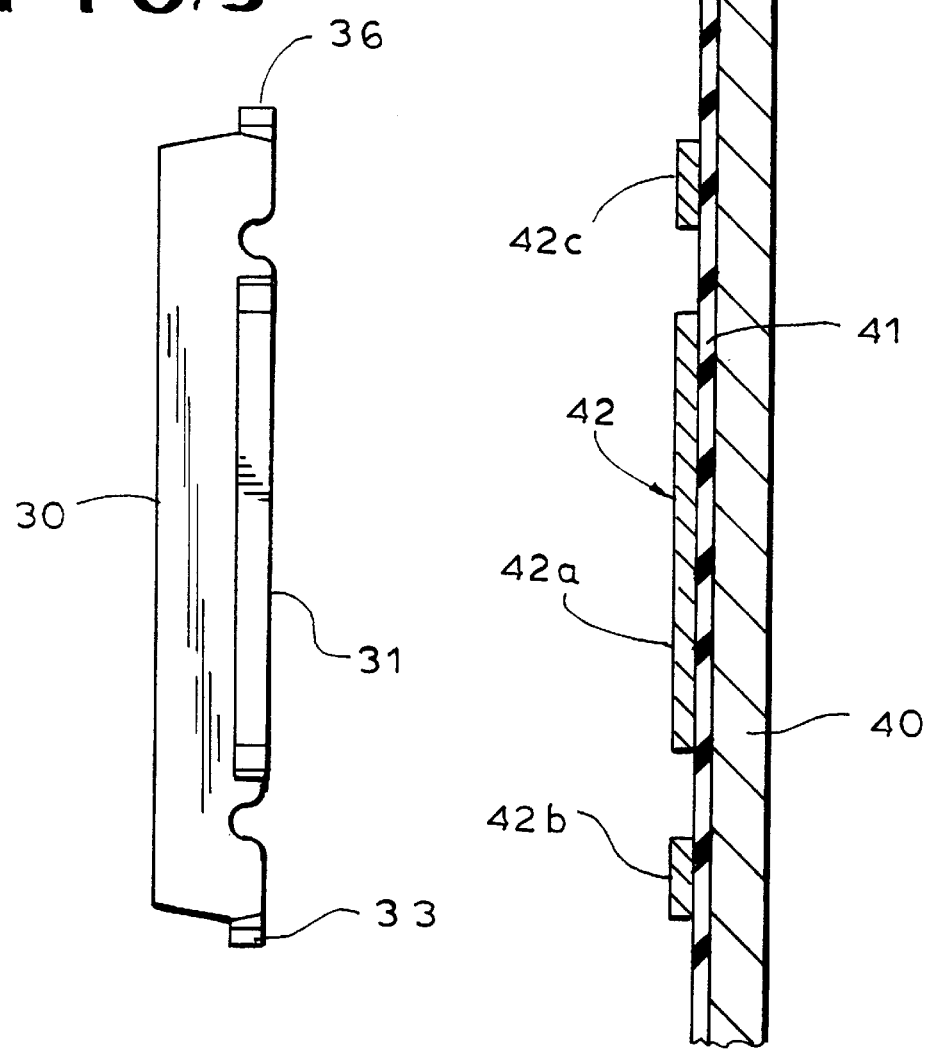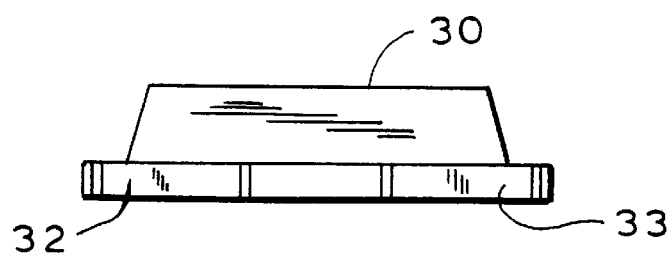

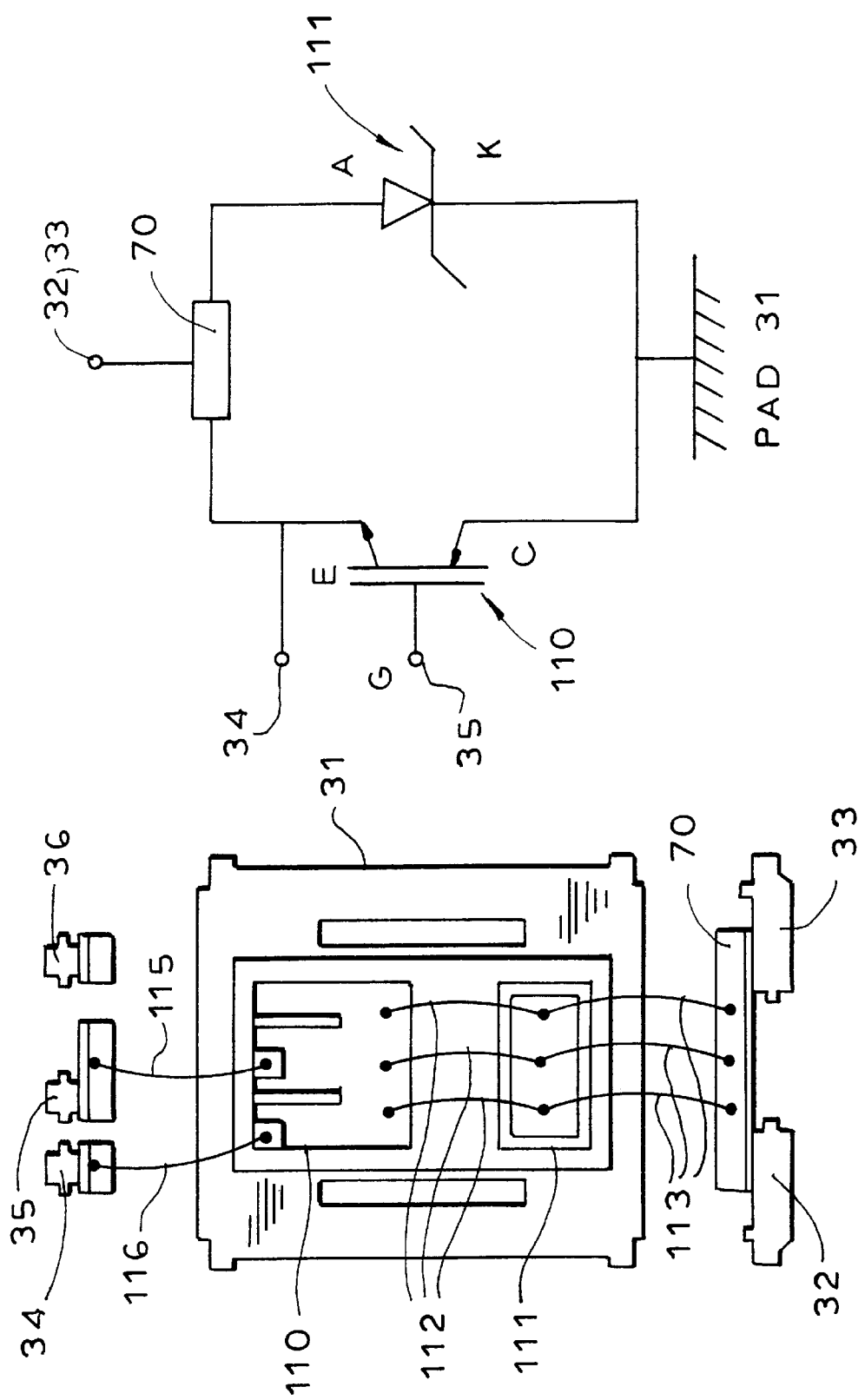

LEAD FRAME WITH WAFFLED FRONT AND REAR SURFACES

CROSS REFERENCE TO RELATED APPLICATION

This application is based on U.S. Provisional patent application No. 60/025,832, filed Sep. 5, 1996, entitled IMPROVED SURFACE-MOUNT HIGH POWER SEMICONDUCTOR PACKAGE AND METHOD OF MANUFACTURE, abandoned.

BACKGROUND OF THE INVENTION

1. Field of the Invention

The present invention relates to semiconductor device packages and lead frames therefor and, more specifically, the invention relates to a high power semiconductor device adapted for surface mounting.

2. Related Art

Packages for high power semiconductor devices which can be surface mounted on flat support board surfaces are well known. One such package is shown in U.S. patent application Ser. No. 08/583,219, filed on Jan. 4, 1996, entitled SURFACE-MOUNT SEMICONDUCTOR PACKAGE which is incorporated herein by reference. Such packages are very well adapted for surface mounting to the conductive patterns of a flat support board, such as an IMS structure (a thick copper or aluminum substrate covered by a thin insulation film which has a thin patternable copper or other conductive solderable upper surface).

It is known to provide a pattern of shallow spaced indentations (or waffles) on one surface of the metal heat sink pad of the prior art surface mount packages, which surface couples to the semiconductor die. It is known that the waffle pattern improves the solder down of the die to the waffled surface.

Of critical concern to designers in the art is the solder down characteristics of the metal heat sink pad of the package to the IMS board. In high power applications, the solder down of the metal heat sink pad is of particular importance because of the need for good heat dissipation.

Surface mount packages of the prior art are designed with metal heat sink pads having smooth flat surfaces, which smooth flat surfaces are soldered to substrates (such as IMSs). Unfortunately, the smooth flat surface of the metal heat sink pad often does not properly wet with solder which results in poor contact with the IMS. Further, when the surface is slightly concave, undesirable solder voids result.

Consequently, heat transfer from the surface mount package to the IMS is adversely affected and elevated die temperatures result (possibly damaging the device). Further, the mechanical integrity of the package to IMS junction may be degraded resulting in poor ruggedness and susceptibility to failure, particularly under vibration. The above disadvantages are exacerbated when the package size increases, and the surface area of the metal heat sink pad correspondingly increases, which is the typically the case in high power devices.

Accordingly, there is a need in the semiconductor packaging art for an improved surface mount package with superior solder down characteristics to the substrate resulting in better thermal and mechanical performance.

SUMMARY OF THE INVENTION

In order to overcome the deficiencies in the prior art, the surface mount package of the present invention includes a semiconductor device, a metal pad on which the semiconductor device is mounted, and a housing formed of a flowable material which bonds to the metal pad and encapsulates the semiconductor device when cured, where the metal pad includes a waffled surface opposite the surface on which the semiconductor device is mounted for accepting solder between the metal pad and a substrate and for permitting solder wetting therebetween.

Other features and advantages of the present invention will become apparent from the following description of the invention which refers to the accompanying drawings.

BRIEF DESCRIPTION OF THE DRAWINGS

For the purpose of illustrating the invention, there is shown in the drawings a form which is presently preferred, it being understood, however, that the invention is not limited to the precise arrangement and instrumentality shown.

FIG. 3 is a side view of the package of the preferred embodiment of the invention;

FIG. 4 is an end view of the main power terminal end of the package of the preferred embodiment of the invention;

FIG. 5 is a cross-sectional view of an IMS support board to which the package of FIGS. 1 to 4 can be mounted;

FIG. 7 shows the lead frame of FIG. 6 with semiconductor die soldered down to the pad and bonding wire connecting the die to external terminals, and shows the manner in which the lead frame is trimmed after the molded housing (not shown) is formed;

FIG. 8 shows a circuit diagram of FIG. 7; and

DETAILED DESCRIPTION OF THE INVENTION

Figure 2:
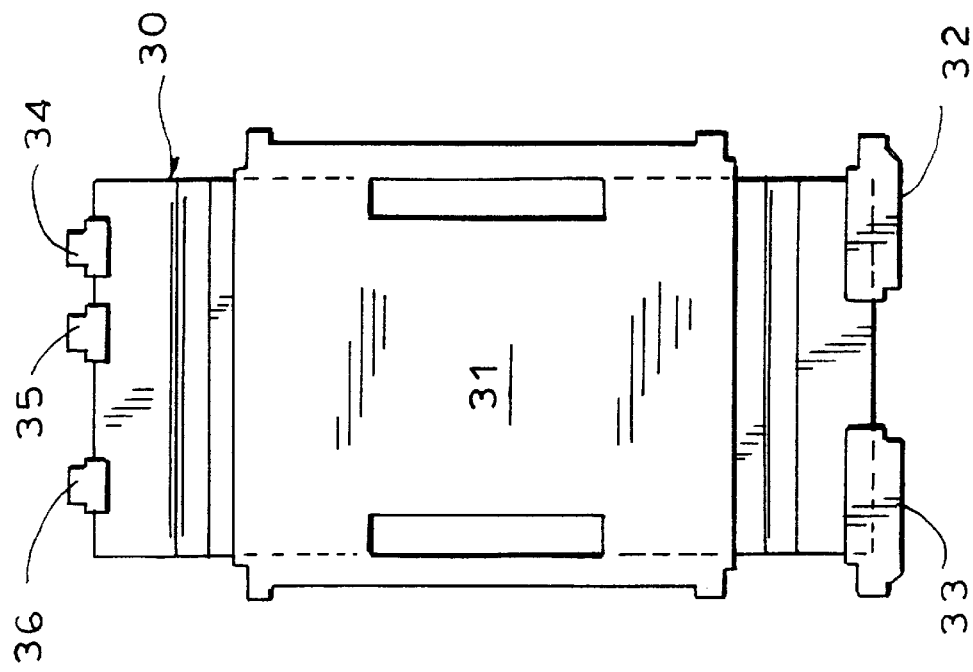
FIG. 2 is a bottom view of the package of the preferred embodiment of the invention.
Figure 1:
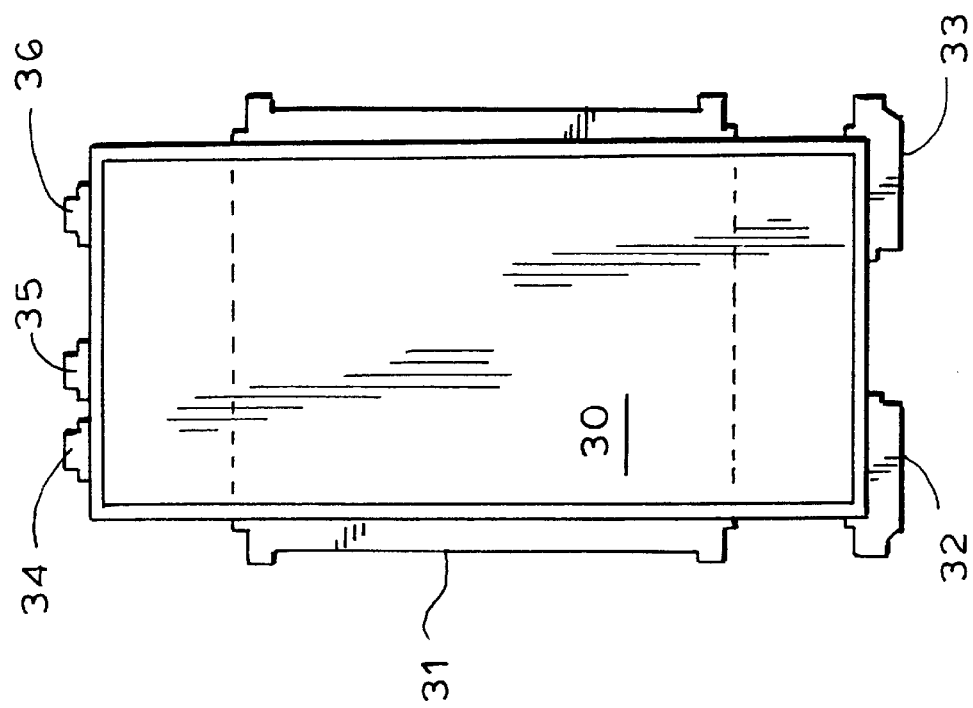
FIG. 1 is a top view of the package of the preferred embodiment of the invention.

Referring now to the drawings wherein like numerals indicate like elements, there is shown in FIGS. 1 to 4, the exterior of the surface-mount package of the preferred embodiment of the invention. The surface mount package includes a molded insulation plastic housing 30 which is an elongated rectangle and incorporates the upper surfaces and portions of the edges of a flat single gauge lead frame which may be a conventional copper alloy about 1.27 mm thick. In a preferred embodiment, housing 30 is about 29 mm long, 14.2 mm wide, and 4.27 mm high. The lead frame is described in more detail below with reference to FIGS. 6, 7 and 9.

The lead frame elements shown in FIGS. 1 to 4 are lead frame heat sink pad 31, power terminals 32 and 33 on the corners of one edge of the rectangular housing 30 and control terminals or pins 34, 35 and 36 along the opposite side of the housing 30.

As shown in FIG. 3, the bottom surfaces of pad 31 and terminals 32 to 36 are preferably co-planar and are capable of connection to the patterned surface of a heat sink support such as an IMS board.

FIG. 5 shows a cross-section of a typical IMS board which consists of a thick thermally conductive (copper or aluminum alloy) substrate 40 which is covered with a very thin insulation polymer 41. A patternable thin conductive solderable layer 42 is disposed atop insulator 41. Any desired pattern can be formed in layer 42 but, in FIG. 5, the layer 42 is separated into a portion 42a and a plurality of segments aligned with terminals 32 to 36. Only segments 42b and 42c, which align, for example, with terminals 32 and 34 respectively, are shown in FIG. 5. It then becomes convenient to solder down the bottom of the package of FIGS. 1 to 4 to the IMS board of FIG. 5, using standard soldering techniques.

Figure 6:
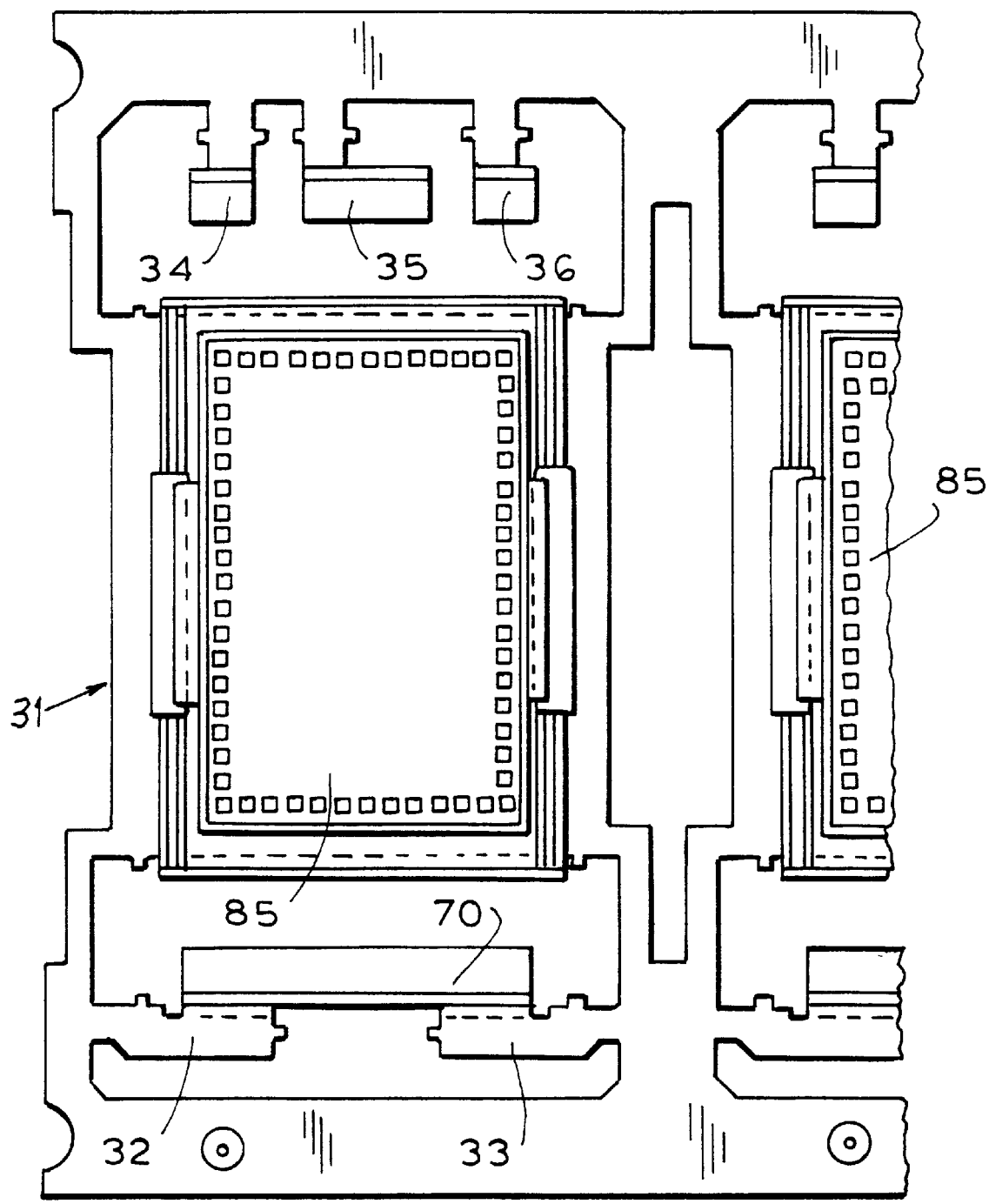
FIG. 6 is a top view of the lead frame used in the package of FIGS. 1 to 4.

Referring to FIG. 6, it is noted that the top central surface of pad 31 has a "waffled" surface 85. The top surface of pad 31 is preferably nickel plated and has a pattern of shallow (preferably about 0.05 mm) spaced indentations, preferably dot-shaped indentations of about 0.25 mm diameter on about 0.6 mm centers.

It is known that this waffle pattern improves the solder down of die to the waffled surface 85. FIG. 7 shows the lead frame pad 31 after two semiconductor device die 110 and 111 have been soldered down to the waffled surface 85 of the pad 31. The particular configuration of die 110 and 111 in one package is called a copack (shown in schematic form in FIG. 8). Die 110 and ill of the copack may be of any type, but are shown in FIGS. 7 and 8 as a power IGBT 110 and a fast recovery diode (FRED) 111, respectively.

It is noted that in FIG. 8 the collector electrode of IGBT 110 is connected to the cathode of FRED diode 111 because those electrodes are soldered to and connected by conductive pad 31. Thus, the conductive pad 31 provides a means for electrically interconnecting the copack to an external circuit. The top emitter electrode of IGBT 110 is wire bonded, as by wires 112 to the anode electrode of FRED diode 111. Wire bonds 113 continue and are connected to cross bar 70 and terminals 32, 33.

Further, a wire bond 115 is made from the gate pad of IGBT 110 to gate terminal 35 and an emitter Kelvin connection 116 may also be provided at terminal 34 as shown in FIG. 7.

Figure 9:
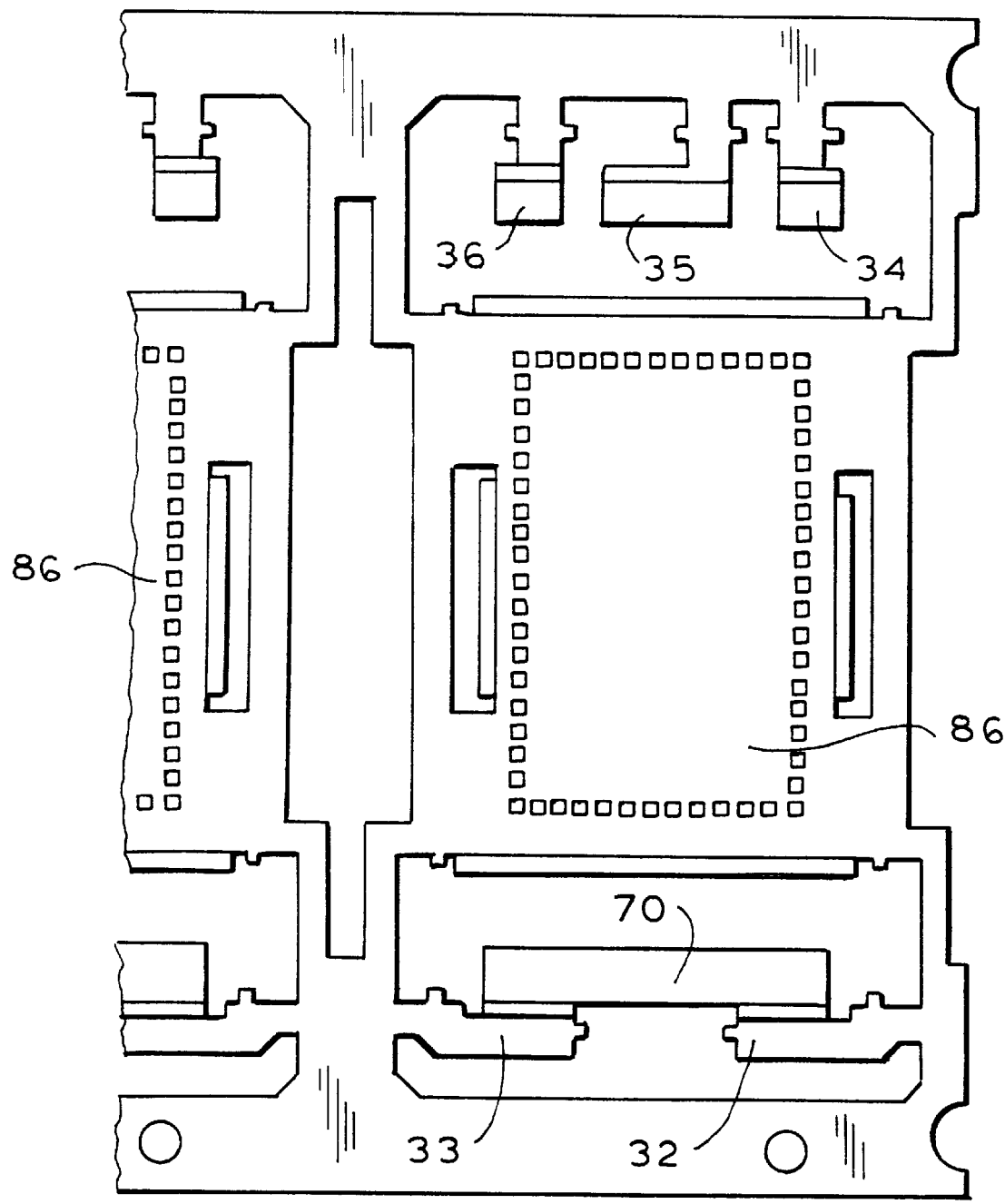
FIG. 9 is a bottom view of the lead frame of FIG. 6.

In accordance with the preferred embodiment of the present invention, FIG. 9 shows that the opposite side of the pad 31 is also provided with a waffle pattern 86. As described above, when this surface is flat, smooth, and slightly concave, inferior wetting and undesirable solder voids can be formed during the solder-down process. However, the waffled surface 86 of the present invention improves wetting and prevents undesirable solder voids during solder down, even when the metal pad 31 is slightly concave.

Consequently, heat transfer from the surface mount package to the IMS is improved and elevated die temperatures are avoided (which mitigates damaging the device). Further, the mechanical integrity of the package to IMS junction is improved resulting in increased ruggedness and immunity to failure, particularly under vibration.

The waffled surface 86 of the preferred embodiment of the present invention is particularly suited for use when the package size increases, and the surface area of the metal heat sink pad correspondingly increases.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A surface mount semiconductor package, comprising:

a semiconductor device;

a metal pad having a first surface on which the semiconductor device is mounted; and a housing formed of a flowable material which bonds to the metal pad and encapsulates the semiconductor device when cured;

the metal pad including a plurality of indentations disposed on a second surface opposite the first surface on which the semiconductor device is mounted, the indentations being sized and shaped to accept solder between the metal pad and a substrate to permit solder wetting therebetween.

2. The surface mount semiconductor package of claim 1, wherein the indentations are about 0.05 mm deep.

3. The surface mount semiconductor package or claim 1, wherein the indentations are dot-shaped.

4. The surface mount semiconductor package of claim 3, wherein the dot-shaped indentations have a diameter of about 0.25 mm, the dot-shaped indentations being located about 0.6 mm center-to-center.

5. The surface mount semiconductor package of claim 1, wherein the metal pad further includes a plurality of indentations on the first surface that the semiconductor device is mounted for accepting solder between the semiconductor device and the first surface and for permitting solder wetting therebetween.

6. The surface mount semiconductor package of claim 5, wherein the indentations on the first surface are about 0.05 mm deep.

7. The surface mount semiconductor package of claim 5, wherein the indentations on the first surface are dot-shaped.

8. The surface mount semiconductor package of claim 7, wherein the dot-shaped indentations have a diameter of about 0.25 mm, the dot-shaped indentations being located about 0.6 mm center-to-center.

* * * * *